(12) United States Patent
Aoki et al.

(10) Patent No.: US 8,988,176 B2
(45) Date of Patent: Mar. 24, 2015

(54) SUPERCONDUCTING ELECTROMAGNET DEVICE, COOLING METHOD THEREFOR, AND MAGNETIC RESONANCE IMAGING DEVICE

(71) Applicant: Hitachi, Ltd., Tokyo (JP)

(72) Inventors: Manabu Aoki, Tokyo (JP); Ryuya Ando, Tokyo (JP); Yukihiro Murata, Tokyo (JP); Ryoji Nakagawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/360,653

(22) PCT Filed: Nov. 28, 2012

(86) PCT No.: PCT/JP2012/080690
§ 371 (c)(1),
(2) Date: May 27, 2014

(87) PCT Pub. No.: WO2013/080986
PCT Pub. Date: Jun. 6, 2013

(65) Prior Publication Data
US 2014/0329688 A1 Nov. 6, 2014

(30) Foreign Application Priority Data

Dec. 1, 2011 (JP) ................................. 2011-264015

(51) Int. Cl.
*H01F 6/00* (2006.01)
*H01F 6/04* (2006.01)
*G01R 33/3815* (2006.01)

(52) U.S. Cl.
CPC .............. *H01F 6/04* (2013.01); *G01R 33/3815* (2013.01); *Y10S 505/844* (2013.01); *Y10S 505/85* (2013.01); *Y10S 505/879* (2013.01); *Y10S 505/893* (2013.01)
USPC ............ 335/216; 62/51.1; 324/318; 324/319; 505/163; 505/844; 505/850; 505/879; 505/893; 361/19

(58) Field of Classification Search
USPC .............. 335/216; 361/19; 62/51.1; 505/162, 505/163, 844, 850, 879, 893; 324/318–320
See application file for complete search history.

(56) References Cited

U.S. PATENT DOCUMENTS

2005/0252219 A1 11/2005 Van Hasselt

FOREIGN PATENT DOCUMENTS

JP 58-061608 A 4/1983
(Continued)

*Primary Examiner* — Ramon Barrera
(74) *Attorney, Agent, or Firm* — Mattingly & Malur, P.C.

(57) ABSTRACT

A superconducting magnet device is configured to include: a refrigerant circulation flowpath in which a refrigerant (R) circulates; a refrigerator for cooling vapor of the refrigerant (R) in the refrigerant circulation flowpath; a superconducting coil cooled by the circulating refrigerant (R); a protective resistor thermally contacting the superconducting coil and having an internal space (S); a high-boiling-point refrigerant supply section for supplying a high-boiling-point refrigerant having a higher boiling point than the refrigerant (R) and frozen by the refrigerant (R) to the internal space (S) in the protective resistor; and a vacuum insulating container for at least accommodating the refrigerant circulation flowpath, the superconducting coil, and the protective resistor.

10 Claims, 6 Drawing Sheets

(56) References Cited

FOREIGN PATENT DOCUMENTS

| | | |
|---|---|---|
| JP | 06-342721 A | 12/1994 |
| JP | 07-122422 A | 5/1995 |
| JP | 08-222429 A | 8/1996 |
| JP | 09-106908 A | 4/1997 |
| JP | 11-219814 A | 8/1999 |
| JP | 11-233334 A | 8/1999 |
| JP | 2000-182821 A | 6/2000 |
| JP | 2005-124721 A | 5/2005 |
| JP | 2005-530976 A | 10/2005 |

A-A' CROSS SECTION

FOURTH EMBODIMENT (a)

(b)

A-A' CROSS SECTION

B-B' CROSS SECTION

C-C' CROSS SECTION

SUPERCONDUCTING ELECTROMAGNET DEVICE, COOLING METHOD THEREFOR, AND MAGNETIC RESONANCE IMAGING DEVICE

TECHNICAL FIELD

The present invention relates to a superconducting electromagnet device, a cooling method therefor, and a magnetic resonance imaging device.

BACKGROUND ART

A superconducting magnet device is configured by a superconducting coil and a permanent current switch that is arranged in parallel with the superconducting coil. This superconducting electromagnet device supplies current from an excitation power source to the superconducting coil in a state that the permanent current switch is opened, and thereafter reduces the supplied current from the excitation power source to zero in a state that the permanent current switch is closed, so as to realize a permanent current operation in which the current is hardly attenuated but continuously flows through a closed circuit, which is in the superconducting state and configured by the superconducting coil and the permanent current switch. Accordingly, the superconducting electromagnet device can retain a magnetic field over a long period.

When normal conducting transition causes resistance in the superconducting coil during the permanent current operation, energy stored in the superconducting coil is converted to thermal energy by Joule heating, thereby increasing a temperature of the coil. There is a case where consumption of the entire stored energy in the superconducting coil leads to an excessive temperature increase, which in turns causes deterioration in performance of as well as burnout of the superconducting coil. In order to avoid this problem, in the circuit described above, the current is supplied to a protective resistor that is provided in parallel with the superconducting coil after occurrence of the normal conducting transition, and the energy is consumed in the superconducting coil and the protective resistor to suppress the temperature increase of the superconducting coil.

In order to retain constituents represented by the superconducting coil and the permanent current switch in superconducting states, an immersion-cooling method in which the constituents are immersed in a refrigerant represented by liquefied helium or liquefied nitrogen for use, and a conduction-cooling method in which a refrigerator and the constituents are thermally connected by a metal having high thermal conductivity for cooling are widely adopted for conventional superconducting electromagnet devices. However, as for the cooling methods just as described, if a device is enlarged, a large amount of the refrigerant is required in the immersion-cooling method, and a temperature gradient is increased in an object to be cooled in the conduction-cooling method, so that it becomes impossible to retain the object to be cooled at a desired temperature. In view of the above, a forced cooling method in which a refrigerant flowpath is provided in the device to forcedly circulate the refrigerant by a pump is adopted for a large device represented by a nuclear fusion device (PTL 1). Meanwhile, for a medium-sized device represented by a magnetic resonance imaging device (MRI), a thermo-siphon method (PTL 2) is suggested in which the refrigerant circulates in the flowpath by utilizing a density difference between the refrigerant that is vaporized by a heat source such as the superconducting coil and the liquefied refrigerant as well as by natural convection.

In order to retain the superconducting electromagnet device in the superconducting state, the immersion-cooling method, in which a superconducting element is immersed in the refrigerant represented by liquid helium or liquefied nitrogen, and the conduction-cooling method, in which the refrigerator and the constituents are thermally connected by the metal having the high thermal conductivity for cooling, have been widely adopted. However, for the large devices such as the nuclear fusion device and the magnetic resonance imaging device (MRI), the forced cooling method or the thermo-siphon method is adopted in which the refrigerant circulates in the flowpath provided in the device, so as to avoid an increase in an amount of the refrigerant to be used and an increase in the temperature gradient in the object to be cooled.

Here, a process of cooling the superconducting electromagnet device from a normal temperature is referred to as initial cooling. For the initial cooling, in the immersion-cooling method, the refrigerant represented by liquefied nitrogen is first fed into the device from a refrigerant inlet, and the refrigerant that is vaporized by heat in the device is discharged from a refrigerant outlet. Then, since a temperature inside the device reaches a liquefaction temperature of the refrigerant, the refrigerant remains therein while maintaining its liquefied state. The initial cooling is terminated when the superconducting element is immersed.

CITATION LIST

Patent Literature

PTL 1: JP-A-7-122422 (FIG. 1, etc.)
PTL 2: LIP-A-6-342721 (FIG. 1, etc.)

SUMMARY OF INVENTION

Technical Problem

Of the cooling methods described above, the forced cooling method (PTL 1) and the thermo-siphon method (PTL 2) provide lower thermal conductivity, than the immersion-cooling method (due to lower cooling efficiency) because only a part of the refrigerant flowpath thermally contacts the superconducting element. Thus, the forced cooling method and the thermo-siphon method leave a problem that the initial cooling cannot be completed in a short time.

In addition, although such a superconducting electromagnet device as described above needs to be retained in a cryogenic state over the long period, there is a case where the temperature thereof is increased for some reason. For example, shutdown of the refrigerator due to power outage or a quench phenomenon in which the normal conducting transition of a part of the coil causes the Joule heating, which in turn causes the normal conducting transition of the entire coil, have been known. Furthermore, in a case of the immersion-cooling method, the refrigerant acts as a cold storage agent to suppress the temperature increase. Meanwhile, it is difficult in the forced cooling method and the thermo-siphon method described above to suppress the temperature increase in comparison with the immersion cooling, because only a small amount of a member that acts as the cold storage agent exists in the flowpath. In view of this, a method for storing a material that serves as the cold storage agent in the device can be considered; however, this produces a problem that necessity in providing a new structural material in the device results in enlargement of the device.

In view of the above points, an object of the invention is to provide a superconducting electromagnet device with superior cooling performance and excellent usability, a cooling method therefor, and a magnetic resonance imaging device.

Solution to Problem

The invention is configured as a superconducting magnet device that includes: a refrigerant circulation flowpath in which, a refrigerant circulates; a refrigerator for cooling vapor of the refrigerant in the refrigerant circulation flowpath; a superconducting coil cooled by the circulating refrigerant; a protective resistor that thermally contacts the superconducting coil and has an internal space; a high-boiling-point refrigerant supply section for supplying a high-boiling-point refrigerant to the internal space of the protective resistor, the high-boiling-point refrigerant having a higher boiling point than the refrigerant and being frozen by the refrigerant; and a vacuum insulating container for at least accommodating the refrigerant circulation flowpath, the superconducting coil, and the protective resistor. The detailed description on the other configurations will be provided in embodiments described below.

Advantageous Effects of Invention

The invention can provide a superconducting electromagnet device with superior cooling performance and excellent usability, a cooling method therefor, and a magnetic resonance imaging device.

DESCRIPTION OF EMBODIMENTS

Next, embodiments of the invention will be described in detail with reference to the accompanying drawings.

In the embodiments, a description will be made on a superconducting electromagnet device for which a forced cooling method and a thermo-siphon method are adopted and which can reduce an initial cooling time and can suppress a temperature increase during shutdown of a refrigerator or occurrence of a quench phenomenon without enlarging the device.

First Embodiment

Figure 1:
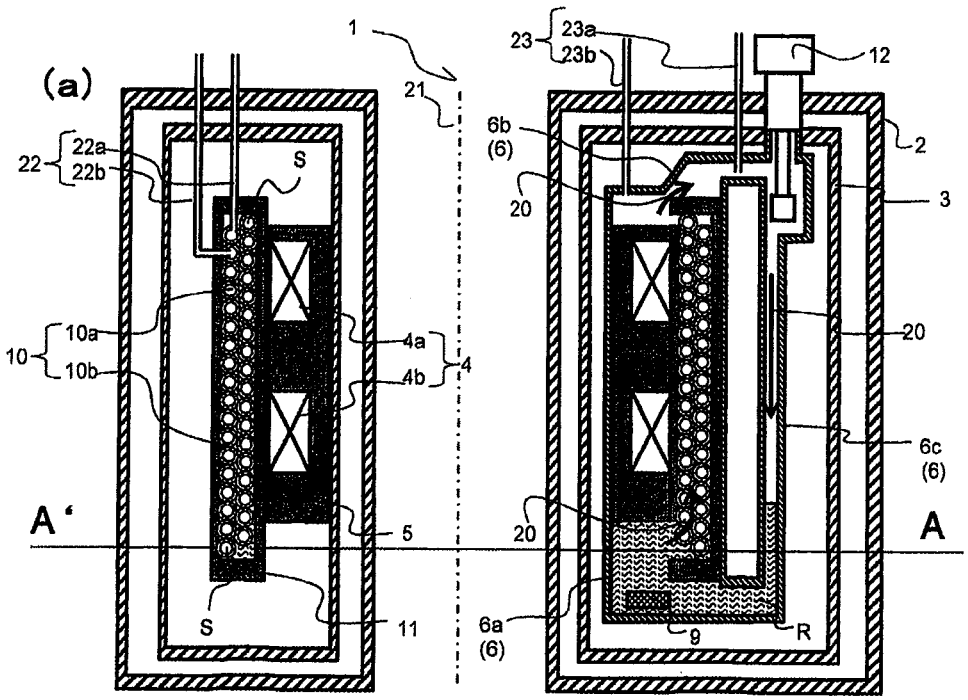
FIG. 1 is a cross-sectional view of a superconducting magnet device according to a first embodiment of the invention, in which (a) shows a vertical cross section at a center position and (b) shows a lateral cross section taken along the line A-A' of (a).
Figure 1:
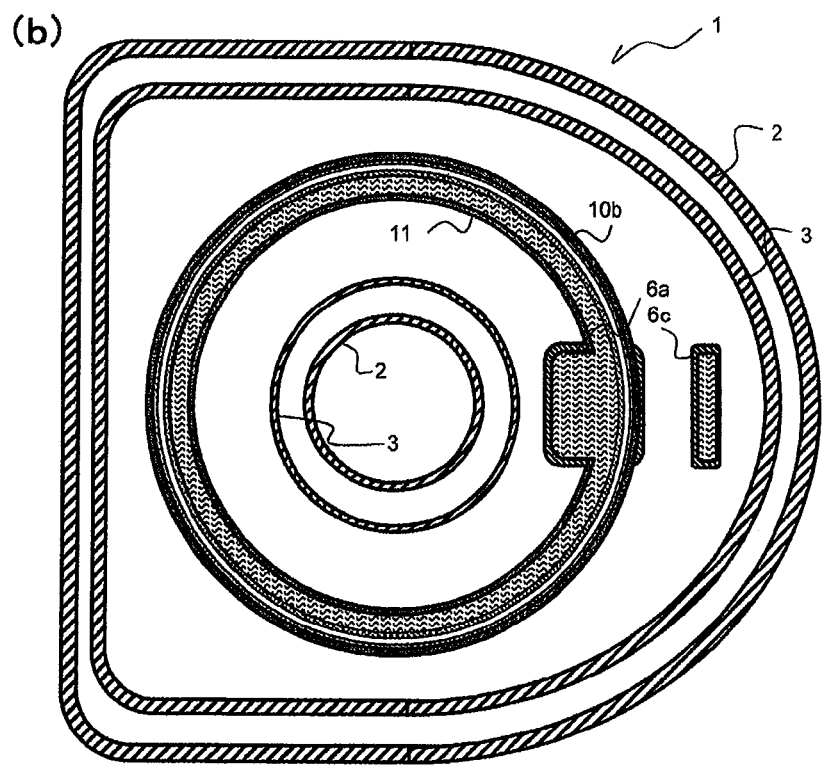

A description will hereinafter be made on a first embodiment to which the invention is applied with reference to FIG. 1 and FIG. 2. FIG. 1 is a cross-sectional view of a superconducting electromagnet device according to the first embodiment of the invention, in which (a) shows a vertical cross section at a center position and (b) shows a lateral cross section taken along the line A-A' of (a).

It should be noted that these cross sections are slice cross sections and thus do not show components on a back side. This also applies to FIG. 3 onward, which will be described below.

As shown in FIG. 1, a superconducting electromagnet device 1 of this embodiment includes a vacuum container 2, a radiation shield 3 contained in the vacuum container 2, a plurality of superconducting coils 4 contained in the radiation shield, a coil bobbin 5, a thermo-siphon section 6 (a lower body section 6a, an upper body section 6b, and a refrigerant descending flowpath section 6c), a permanent current switch 9, a protective resistor 10, a protective resistor accommodating section 11, and the like. The device also includes the vacuum container 2, the radiation shield 3, a refrigerator 12, and the like. A center axis 21 of the superconducting coil 4 of this embodiment is vertically directed. In other words, an upper side of the sheet is upward while a lower side of the sheet is downward in FIG. 1(a).

The superconducting electromagnet device 1 according to the first embodiment is, for example, applied to a nuclear magnetic resonance device.

As shown in FIG. 1(a), the two superconducting coils 4 of the first embodiment are provided, which are denoted by reference numerals 4a and 4b. The superconducting coils 4 are wound around the coil bobbin 5. Since the superconducting coils 4 and the coil bobbin 5 in this example are well known, a detailed description thereof will not be made.

The annular-shaped protective resistor accommodating section 11 that thermally contacts and surrounds the superconducting coils 4 and the coil bobbin 5 is disposed on an outer periphery of the coil bobbin 5. The protective resistor 10 is accommodated in the protective resistor accommodating section 11. In the example of this drawing, the protective resistor 10 is tightly wound in a double-coiled shape having an inner layer and an outer layer and is accommodated in the protective resistor accommodating section 11. The protective resistor 10 includes a protective resistor tubes 10a, 10b, each configured in a tubular shape. The protective resistor tube 10a corresponds to the superconducting coil 4a while the protective resistor tube 10b corresponds to the superconducting coil 4b. In other words, in the protective resistor accommodating section 11, the protective resistor tube 10a is positioned in an upper part while the protective resistor tube 10b is positioned in a lower part.

A supply and discharge section 22 (a supply section 22a and a discharge distribution section 22b) of high-boiling-point refrigerant that corresponds to a "high-boiling-point refrigerant supply section" is connected to the protective resistor tubes 10a, 10b that surround the coil bobbin 5 annularly. Then, the high-boiling-point refrigerant is arranged to flow through a high-boiling-point refrigerant path (an internal space S) in the protective resistor tubes 10a, 10b by supplying the high-boiling-point refrigerant from the supply section 22a and discharging the high-boiling-point refrigerant from the discharge distribution section 22b. Accordingly, the coil bobbin 5 (and further the superconducting coils 4) can be cooled rapidly. Here, the high-boiling-point refrigerant is liquefied nitrogen, for example.

In the first embodiment, the protective resistor tubes 10a and 10b are communicated with each other to constitute the substantially single high-boiling-point refrigerant path (the internal space S). The one supply and discharge section 22 is provided in this example; however, the two supply and discharge sections 22 need to be provided if the protective resistor tubes 10a and 10b are independent of each other. In addition, the supply and discharge section 22 has the high-boiling-point refrigerant supply section 22a and the high-boiling-point refrigerant discharge section 22b, that is, has a dedicated inlet and a dedicated outlet. However, a single section may serve as both of the inlet and the outlet.

Here, the protective resistor 10 is configured that a normal conductive wire represented by oxygen-free copper or a normal conductive wire with same electric and magnetic properties as oxygen-free copper is wound in a nonconductive manner (tightly wound in this example) so as not to be magnetically coupled with the superconducting coils 4. Wound in a nonconductive manner indicates, for example, that the number of clockwise windings is set equal to the number of counterclockwise windings.

Next, the thermo-siphon section 6 is disposed on a right side in the superconducting magnet device 1 with a positional relationship in FIGS. 1(a), (b) as a reference. More specifically, the thermo-siphon section 6 of this embodiment is disposed in a direction of three o'clock in a clockwise direction in FIG. 1(b), and is mainly configured by a main body (the lower body section 6a, the upper body section 6b) and the independent refrigerant descending flowpath section 6c that connects a lower end of the lower body section 6a and an upper end of the upper body section 6b. The refrigerant descending flowpath section 6c is configured to have a wide rectangular cross section. The thermo-siphon section 6 includes a liquid reservoir for a refrigerant R in the lower body section 6a. The refrigerant R is vaporized by heat such as that generated by the superconducting coils 4, and vapor thereof that ascends from a surface of the liquid reservoir is guided to the upper body section 6b (details will be described below) and is liquefied in the refrigerator 12. The liquefied refrigerant R descends in the refrigerant descending flowpath section 6c by gravity and circulates to return to the liquid reservoir in the lower body section 6a. The refrigerant R is liquefied helium whose boiling point is lower than liquefied nitrogen as the high-boiling-point refrigerant described above. The refrigerant R is supplied to the inside of the thermo-siphon section 6 through a refrigerant supply section 23a and discharged from the inside of the thermo-siphon section 6 through a refrigerant discharge section 23b.

The thermo-siphon section 6 of this embodiment is configured to partially accommodate the superconducting coils 4 and the coil bobbin 5 (right end portions) while maintaining liquid-tight and airtight states thereof. On the inside of the thermo-siphon section 6, the thermo-siphon section 6 communicates with the inside of the protective resistor accommodating section 11. More specifically, the lower body section 6a communicates with a lower part of the protective resistor accommodating section 11, and the upper body section 6b communicates with an upper part of the protective resistor accommodating section 11. Thus, as it can be understood from FIGS. 1(a), (b), the liquid reservoir of the refrigerant R is formed not only in the lower body section 6a but also in the lower part of the protective resistor accommodating section (a space between the protective resistor tubes 10b). A liquid surface of the refrigerant R in the liquid reservoir formed in the lower body section 6a is positioned between a lower end of the coil bobbin 5 and a lower end of the superconducting coil 4b in this example.

When the protective resistor 10 (the protective resistor tubes 10a, 10b) accommodated in the protective resistor accommodating section 11 is tightly wound as shown in FIG. 1(a), the vapor produced by the vaporized refrigerant R is prevented from ascending in a vertical direction (straight up). However, since the protective resistor tubes 10a, 10b each has a substantially circular radial cross section in this embodiment, a space is formed between the protective resistor tubes 10a, 10b that are adjacent to each other as well as between the protective resistor 10 (the protective resistor tubes 10a, 10b) and an inner wall of the protective resistor accommodating section 11 even when the protective resistor 10 (the protective resistor tubes 10a, 10b) is wound tightly. Then, the lower body section 6a communicates with the upper body section 6b through such spaces. In other words, such spaces, that is, (1) the space between the protective resistor tubes 10a, 10b and (2) the space between each of the protective resistor tubes 10a, 10b and the inner wall of the protective resistor accommodating section 11 each functions as a path (a helical path) through which the vapor of the refrigerant R that ascends from the surface of the liquid reservoir in the lower body section 6a is directed to the upper body section 6b. More specifically, this helical path functions to transfer cold heat of the refrigerant R to the entire device, in other words, functions to draw the heat generated by the superconducting coils 4 and heat entered from the outside, so as to cool the superconducting coils 4 and equalize the temperature.

When considering the space (the path), it can also be said in a broad sense that the annular protective resistor accommodating section 11 also constitutes the thermo-siphon section 6.

Next, a description will be made on a circuit of the superconducting magnet device 1 with reference to FIG. 2.

Figure 2:
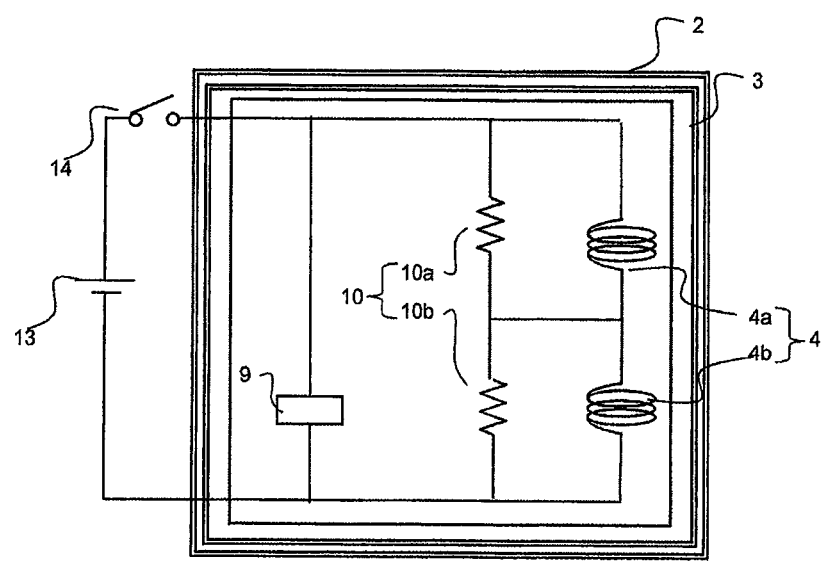
FIG. 2 is a view for schematically showing a circuit of the superconducting magnet device in FIG. 1.

FIG. 2 is a view for schematically showing the circuit of the superconducting electromagnet device 1.

As shown in FIG. 2, and as described above, the protective resistor 10 is configured by the protective resistor tubes 10a, 10b that are respectively arranged in parallel with the plurality of superconducting coils 4 (4a, 4b). While these components are arranged in the vacuum container 2 (in the radiation shield 3), an excitation power source 13 and a current breaker 14 are arranged on the outside of the vacuum container 2. Here, the superconducting coils 4 and the permanent current switch 9 are maintained at a critical temperature or lower and brought into the superconducting states. Meanwhile, the protective resistor 10 is cooled at about a same temperature level as the superconducting coils 4 and the permanent current switch 9.

In a case where current is supplied from the excitation power source 13 to the superconducting coils 4 in a state that the permanent current switch 9 is opened, where the supplied current from the excitation power source 13 is then set to zero, and where the current breaker 14 is opened in a state that the permanent current switch 9 is closed, the permanent current operation is realized in which the current is hardly attenuated but continuously flows through the closed circuit, which is in the superconducting state and configured by the superconducting coil 4 and the permanent current switch 9. Accordingly, the superconducting electromagnet device 1 can retain a magnetic field over a long period.

As described above, the superconducting electromagnet device 1 adopts the thermo-siphon method in which the refrigerant R circulates for cooling in the thermo-siphon section 6 provided in the device to maintain the superconducting coils 4 and the permanent current switch 9 in the superconducting states. The refrigerant R, which has been vaporized by the heat generated in the superconducting coils 4 provided at the center of the superconducting electromagnet device 1, ascends by buoyancy generated by the density difference, and is condensed again by the refrigerator 12 to descend, thereby circulating in a direction indicated by an arrow 20 in the drawing. This cooling method produces an advantage over the immersion-cooling method in that an amount of the refrigerant to be used can be reduced. However, due to a small contact area between the superconducting coil 4 and the refrigerant R, a problem remains that a long time is required for the initial cooling to cool the superconducting electromagnet device 1 from the normal temperature. In addition, there is a case where the temperature of the superconducting coil 4 increases due to the shutdown of the refrigerator 12 caused by the power outage or due to the quench phenomenon that causes the normal conducting transition of the entire superconducting coil 4. In the immersion-cooling method, the refrigerant acts as the cold storage agent to allow suppression of the temperature increase. Meanwhile, in the thermo-siphon method described above, since no member acting as the cold storage agent exists in the flowpath except for the refrigerant R, it is difficult to suppress the temperature increase in comparison with the immersion-cooling method.

Thus, the inventors have focused on the above point and, as described below, have adopted a configuration in which the protective resistor 10, which is electrically connected in parallel with the superconducting coils 4, thermally contacts the superconducting coils 4 and the thermo-siphon section 6 and in which a flowpath (the internal space S) is provided in the high-boiling-point refrigerant path in the protective resistor 10, so as to supply a refrigerant (liquefied nitrogen) having a higher freezing point than the refrigerant R (liquefied helium) that circulates in the thermo-siphon section 6. This enhances a cooling structure during the initial cooling, and the refrigerant (the high-boiling-point refrigerant) having the higher freezing point than the refrigerant R functions as the cold storage agent that suppresses the temperature increase during the power outage or during quenching.

An operation of the superconducting magnet device 1 according to the first embodiment will be described below.

(Initial Cooling by the High-Boiling-Point Refrigerant)

Upon the initial cooling from a room temperature, the high-boiling-point refrigerant (liquefied nitrogen) is supplied from the high-boiling-point refrigerant supply section 22a of the high-boiling-point refrigerant supply and discharge section 22 to the high-boiling-point refrigerant path, which is provided in each of the protective resistor tubes 10a, 10b. The protective resistor tubes 10a, 10b, which are each provided with the high-boiling-point refrigerant path therein, are thermally connected to the superconducting coils 4 and the coil bobbin 5, and the protective resistor tubes 10a, 10b are further thermally connected to the thermo-siphon section 6. Accordingly, the high-boiling-point refrigerant evaporates and increases the temperature thereof while cooling these components (the inside of the device) by a latent heat or a sensible heat, and is discharged from the high-boiling-point refrigerant discharge section 22b. As the high-boiling-point refrigerant is continuously supplied from the high-boiling-point refrigerant supply section 22a, the inside of the device is further cooled, and an evaporated amount of the high-boiling-point refrigerant is consequently reduced. In addition, the inside of each of the protective resistor tubes 10a, 10b, that is, the high-boiling-point refrigerant path (the internal space S) is filled with the high-boiling-point refrigerant.

Concurrently with cooling through the protective resistor 10, the high-boiling-point refrigerant (liquefied nitrogen) is also supplied from the refrigerant supply section 23a of a refrigerant supply and discharge section 23 to the thermo-siphon section 6. This high-boiling-point refrigerant cools the inside of the thermo-siphon section 6 and thereby cools the coil bobbin 5 (the superconducting coils 4) and the protective resistor 10.

Termination of the initial cooling can be determined, for example, by measuring a temperature inside the device by an unillustrated temperature sensor and/or by measuring a temperature of the high-boiling-point refrigerant that is discharged from the high-boiling-point refrigerant discharge section 22b or the refrigerant discharge section 23b.

(Cooling by a Low-Boiling-Point Refrigerant)

After the termination of the initial cooling by the high-boiling-point refrigerant described above, the high-boiling-point refrigerant that has been used for the initial cooling is removed from the thermo-siphon section 6, and the refrigerant R having a lower boiling point (the freezing point) than the high-boiling-point refrigerant is next supplied from the refrigerant supply section 23a to the thermo-siphon section 6 to finish the cooling. At this time, the high-boiling-point refrigerant is retained in the protective resistor tubes 10a, 10b.

The above-mentioned refrigerant R that is supplied to the thermo-siphon section 6 uses the sensible heat and the latent heat thereof to directly cool the coil bobbin 5 and the like (that is, cool the superconducting coils 4) while cooling the inside of the device, evaporates, increases a temperature thereof, and is then discharged from the refrigerant discharge section 23b. In this embodiment, since the protective resistor 10 (the protective resistor tubes 10a, 10b) is wound tightly, the evaporated refrigerant R cannot ascend in the vertical direction (straight up) as described above and thus ascends while swirling in the space between the resistor tubes 10a, 10b and the like to cool the inside of the device.

The inside of the device is further cooled by continuously supplying the refrigerant R from the refrigerant supply section 23a, the evaporated amount of the refrigerant R is consequently reduced, the liquid reservoir of the refrigerant R is then formed in the lower body section 6a of the thermo-siphon section 6, and the superconducting coils 4 and the permanent current switch 9 are brought into the superconducting states.

The refrigerator 12 may start an operation at this point or may start the operation at arbitrary timing before or after this point.

As described above, the high-boiling-point refrigerant that is supplied to the inside of the protective resistor 10 during the initial cooling is not removed but is retained. Accordingly, the high-boiling-point refrigerant in the protective resistor 10 exists in a solidified state. For example, when nitrogen is solidified, a specific heat thereof at a temperature of 30K or lower is twice or three times larger than that of silver or copper with a same volume. Thus, nitrogen exhibits a superior effect as the cold storage agent. Therefore, it is possible to suppress the temperature increase during the shutdown of the refrigerator 12 or during occurrence of the quench phenomenon. In addition, as described above, the protective resistor 10 adopts the structure in which the normal conductive wire represented by oxygen-free copper is tightly wound in the nonconductive manner to prevent magnetic coupling with the superconducting coils 4. Also, as shown by the A-A' cross section in the drawing, the refrigerant can move in the space between the normal conductive wires, and the space serves as a heat conductive path in a circulating direction. Thus, there is no need to provide an additional heat conductive path.

(Outline)

As it has been described so far, the superconducting electromagnet device 1 of this embodiment supplies the high-boiling-point refrigerant to the flowpath, which is provided in the protective resistor 10, during the initial cooling, and thus can terminate the initial cooling in a short time when compared to a case where the refrigerant is only supplied to the thermo-siphon section 6 (a refrigerant circulating path). In addition, the high-boiling-point refrigerant retained in the protective resistor 10 functions as the cold storage agent, so as to allow the suppression of the temperature increase during the shutdown of the refrigerator 12 or during the quench phenomenon. Since the protective resistor 10 also serves as the heat conductive path in the circulating direction, the heat conductive path that has to be arranged separately can be omitted. Thus, it is possible to downsize the device.

In other words, it is possible to provide the superconducting electromagnet device 1 that adopts the forced cooling method and the thermo-siphon method, that can reduce the initial cooling time, and that can suppress the temperature increase during the shutdown of the refrigerator or during quenching without enlarging the device.

Although the protective resistor tubes 10a, 10b are wound on the outer peripheral side of the superconducting coils 4, they may be wound on an inner peripheral side (the inner peripheral side and/or the outer peripheral side) thereof. Here, as examples of the inner peripheral side, a space between the superconducting coils 4 and the coil bobbin 5 and an inner peripheral side of the coil bobbin 5 can be raised (see the superconducting coil 4a and the like in a third embodiment (FIG. 4), which will be described below).

Second Embodiment

Next, a second embodiment to which the invention is applied will be described with reference to FIG. 3 and the like.

Figure 3:
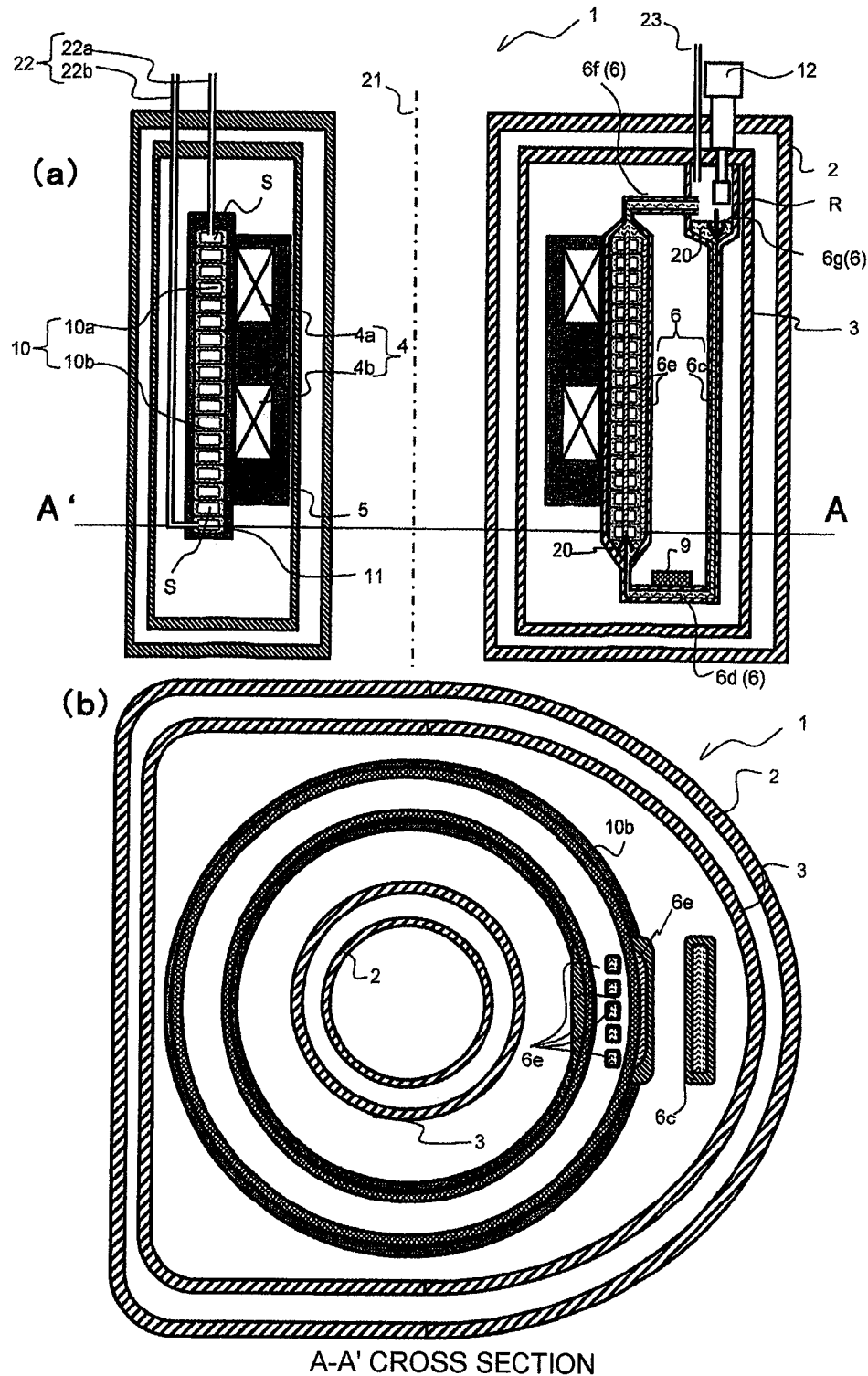
FIG. 3 is a cross-sectional view of the superconducting magnet device according to a second embodiment of the invention, in which (a) shows a vertical cross section at the center position and (b) shows a lateral cross section taken along the line A-A' of (a).

FIG. 3 is a cross-sectional view of the superconducting electromagnet device 1 according to the second embodiment, in which (a) shows a vertical cross section at the center position and (b) shows a lateral cross section taken along the line A-A' of (a).

The same elements as those in the first embodiment are denoted by the same reference numerals as those used in the first embodiment, and the description thereof will not appropriately be repeated.

The second embodiment is same as the first embodiment shown in FIG. 1 in a point that the thermo-siphon section 6 is provided in a position in the direction of three o'clock in the clockwise direction of the superconducting magnet device 1 (see FIG. 3(b)). In addition, the second embodiment is same as the first embodiment shown in FIG. 1 in points that the protective resistor 10 is configured as the resistor tubes 10a, 10b and that the high-boiling-point refrigerant path (the internal space S) is formed therein, and the like.

However, as shown in FIG. 3, since each of the protective resistor tubes 10a, 10b has the square radial cross section, there is no space between the protective resistor tubes 10a, 10b or between each of the protective resistor tubes 10a, 10b and the inner wall of the protective resistor accommodating section 11. Accordingly, in the first embodiment, the high-boiling-point refrigerant that is supplied to the thermo-siphon section 6 during the initial cooling and the refrigerant R after the initial cooling can flow through the spaces between the protective resistor tubes 10a, 10b, and the like, swirl about the center axis 21, and ascend from the lower body section 6a to the upper body section 6b. However, this cannot be achieved in the second embodiment. Thus, in the second embodiment, a closed flowpath in which the high-boiling-point refrigerant during the initial cooling and the refrigerant R after the initial cooling can ascend is provided in the thermo-siphon section 6.

More specifically, as shown in FIGS. 3(a), (b), the thermo-siphon section 6 of the second embodiment includes the refrigerant descending flowpath section 6c, a lower flowpath section 6d, a refrigerant ascending flowpath section 6e, an upper flowpath section 6f, and a liquid reservoir section 6g, and they are connected in this order. Then, it is configured that the high-boiling-point refrigerant and the refrigerant R are respectively spread in the thermo-siphon section 6 during the initial cooling and after the initial cooling and that the refrigerant R circulates in the thermo-siphon section 6 by the thermo-siphon especially during a normal operation after the initial cooling and promotes the cooling.

The refrigerator 12 is disposed to cool an upper space of the liquid reservoir section 6g to liquefy the vapor of the refrigerant R.

In the second embodiment, the refrigerant ascending flowpath section 6e is divided into plural flowpaths in parallel. As shown in FIG. 3(b), one of them is the refrigerant ascending flowpath section 6e that is disposed to hold the protective resistor 10 between an inner peripheral side and an outer peripheral side thereof in the thermo-siphon section 6. As shown in FIG. 3(a), another one is the refrigerant ascending flowpath section 6e that is disposed to penetrate the protective resistor 10 in an up-down direction (corresponds to that "the plural refrigerant circulation flowpaths penetrate the inside of the protective resistor"). In this example, the five refrigerant ascending flowpath sections 6e are disposed to penetrate as shown in FIG. 3(b).

The refrigerant descending flowpath section 6c is configured to have the wide rectangular cross section as in the first embodiment. This also applies to the lower flowpath section 6d.

In addition, in the second embodiment, the permanent current switch 9 is disposed to thermally contact an upper part of the lower flowpath section 6d, and is configured to be cooled by thermal conductivity.

While the configuration of the refrigerant supply and discharge section 23 slightly differs from that in the first embodiment, the operation during the initial cooling, the operation after the initial cooling, the operation during the quench phenomenon, and the like in the second embodiment are substantially the same as those in the first embodiment, and thus the description thereof will not be repeated.

According to the second embodiment, while the same effects (rapid cooling and a heat storing action) as those in the first embodiment can be obtained, it is also possible to remove the refrigerant flowpath in the circumferential direction that is seen in the first embodiment. Accordingly, a volume of the flowpath in which the refrigerant R ascends (a volume inside the refrigerant ascending flowpath section 6e) is reduced with respect to a refrigerant solidifying flowpath section 6c in which the refrigerant R descends, so as to increase a difference in mass of the refrigerant R in the flowpaths, and thus the refrigerant R can ascend to a high position. Facts that the liquid reservoir section 6g is disposed in an upper part and that an ascending path of the refrigerant R is shorter than that in the first embodiment (smaller pressure loss) also contribute to elevation of the liquid surface of the refrigerant R. Accordingly, there is no need to dispose plural refrigerant containers on upper and lower sides of the device, and thus the superconducting electromagnet device 1 can be downsized.

To give further details, as shown in FIG. 3(a), the liquid surface of the refrigerant R in the refrigerant ascending flowpath section 6e is higher than the liquid surface of the refrigerant R in the liquid reservoir section 6g, and reaches the upper flowpath section 6f (and the refrigerant R overflows into the liquid reservoir section 6g). This is because the refrigerant in the refrigerant ascending flowpath section 6e is mixed with the vapor of the refrigerant R that is evaporated by the heat generated by the superconducting coil 4 and the like, and the buoyancy of the vapor and the like cause an action to lift the liquid surface of the refrigerant R in the refrigerant descending flowpath section 6c (an increase in the vapor contained in the refrigerant R reduces the mass per unit volume). Accordingly, the thermo-siphon is configured, and the refrigerant R circulates clockwise in FIG. 3(a).

Third Embodiment

Next, a third embodiment to which the invention is applied will be described with reference to FIG. 4 and the like.

Figure 4:
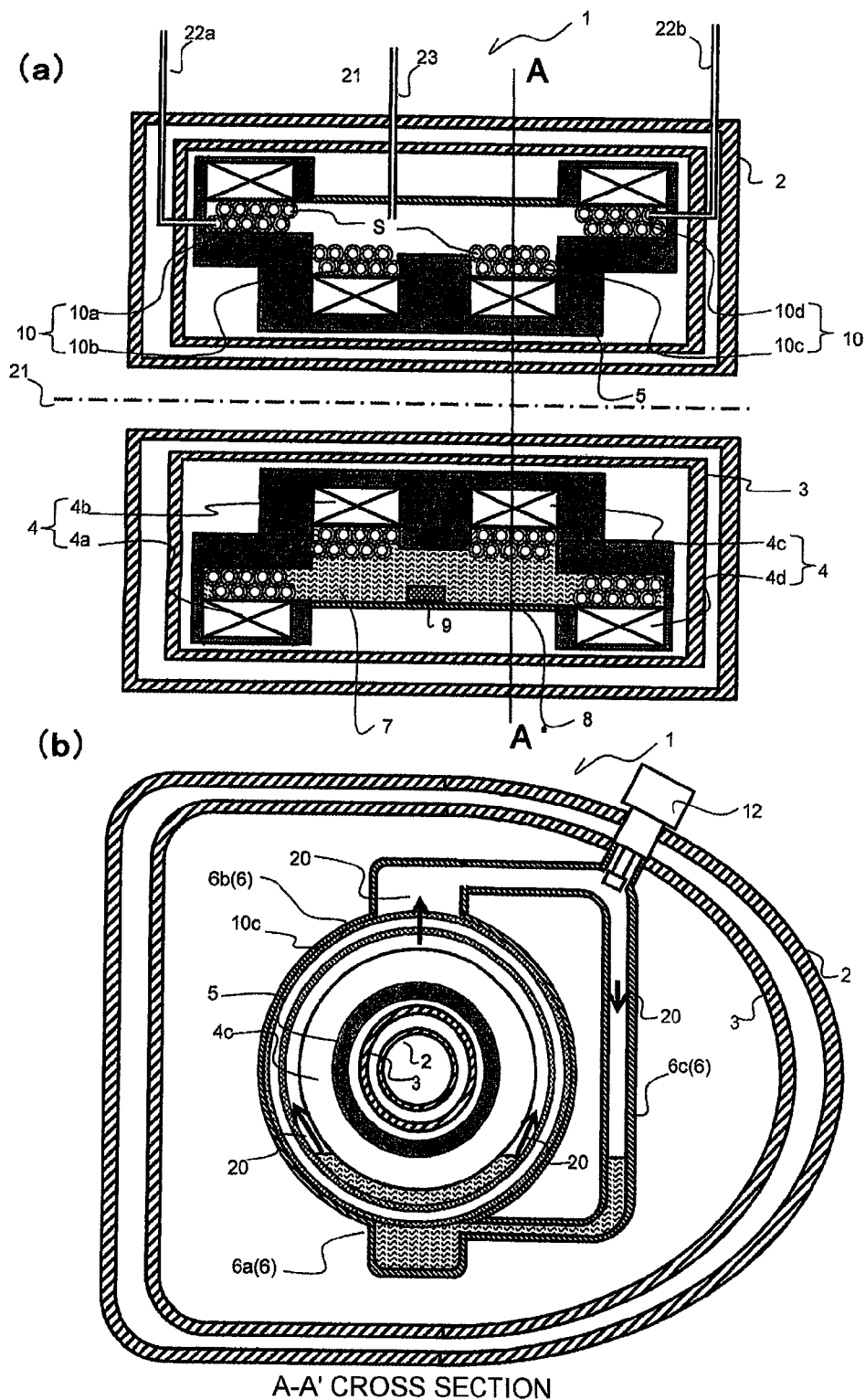
FIG. 4 is a cross-sectional view of the superconducting magnet device according to a third embodiment of the invention, in which (a) shows a vertical cross section at the center position and (b) shows a lateral cross section taken along the line A-A' of (a).

FIG. 4 is a cross-sectional view of the superconducting electromagnet device according to the third embodiment, in which (a) shows a vertical cross section at the center position and (b) shows a lateral cross section taken along the line A-A' of (a).

The same elements as those in the first embodiment and the like are denoted by the same reference numerals as those used in the first embodiment and the like, and the description thereof will appropriately not be repeated.

The third embodiment differs from the first embodiment shown in FIG. 1 in points that the plural superconducting coils 4 with different diameters exist, that the center axis 21 of the superconducting coils 4 is horizontally directed, and that the refrigerant R in the thermo-siphon section 6 is directed upward in the vertical direction while following an outer peripheral surface of each of the plural superconducting coils 4 in the circumferential direction.

In other words, in the third embodiment, "a center axis of the superconducting coil is horizontally directed, and the protective resistor thermally contacts any of an outer peripheral surface, an inner peripheral surface, and a bobbin of the superconducting coil".

The superconducting magnet device 1 of the third embodiment is, for example, applied to a magnetic resonance imaging device in a medical field. The superconducting magnet device 1 includes, as the superconducting coils 4, the superconducting coils 4a, 4d (shield coils) in addition to the superconducting coils 4b, 4c (main coils), and an imaging area is configured substantially at the center of the device. In addition, the four protective resistors 10 (the protective resistor tubes 10a to 10d) are provided to correspond to the four superconducting coils 4 (4a to 4d). Of them, the protective resistors 10a, 10d are wound tightly on the inner peripheral sides of the corresponding superconducting coils 4a, 4d while thermally contacting the superconducting coils 4a, 4d, respectively. Meanwhile, the protective resistors 10b, 10c are wound tightly on the outer peripheral sides of the corresponding superconducting coils 4b, 4c while thermally contacting the superconducting coils 4b, 4c, respectively. In other words, the protective resistor accommodating section 11 of the first embodiment is not provided in the third embodiment.

The reference numerals 6a to 6c are used for the same components as those in the first embodiment.

The superconducting magnet device 1 of the third embodiment is the superconducting electromagnet device 1 (an MRI device of tunnel type) in which the plural superconducting coils 4 with the different diameters exist and the center axis 21 thereof is horizontally directed. However, the same effects as those in the first embodiment can be obtained in the third embodiment, and downsizing of the superconducting electromagnet device 1 and the like can be achieved.

The above-mentioned superconducting magnet devices of the first embodiment and the second embodiment may be applied to the MRI device as that of the third embodiment.

Fourth Embodiment

Next, a fourth embodiment to which the invention is applied will be described with reference to FIG. 5A, FIG. 5B, and the like.

Figure 5A:
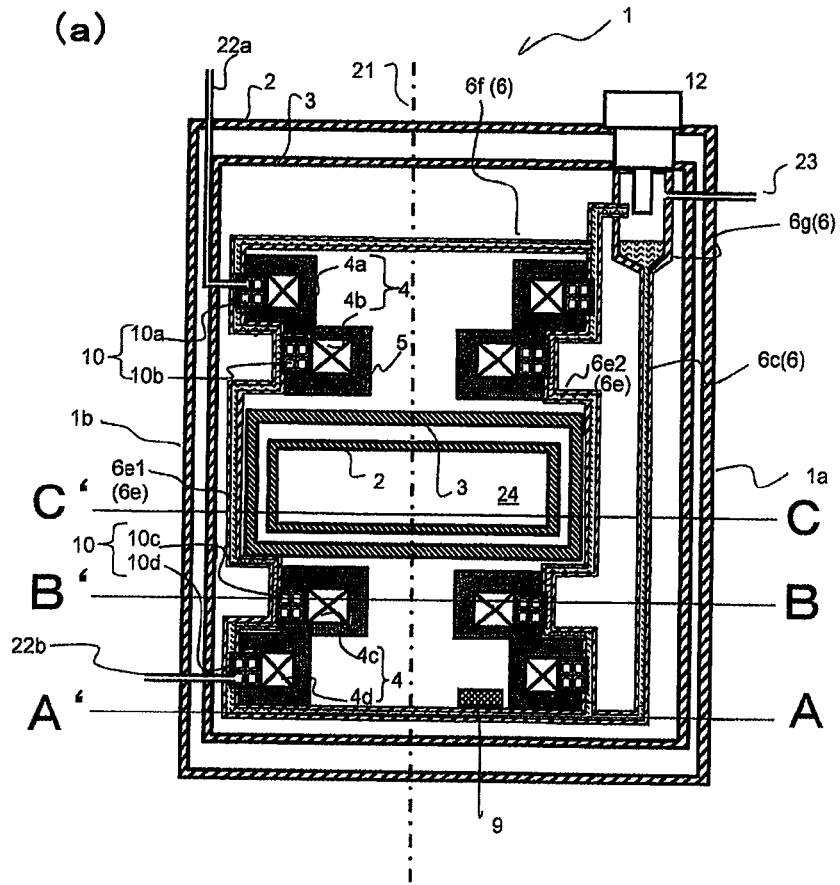
FIG. 5A is a cross-sectional view of the superconducting magnet device according to a fourth embodiment of the invention, in which (a) shows a vertical cross section at the center position and (b) shows a lateral cross section taken along the line A-A' of (a).
Figure 5A:
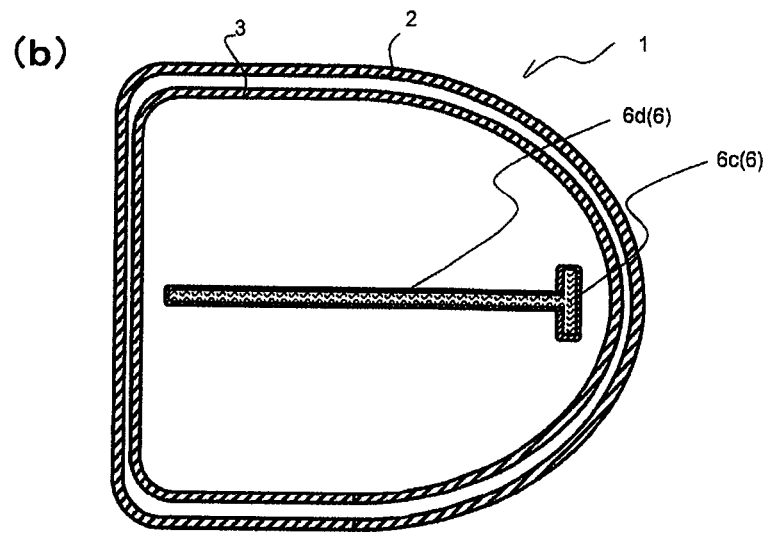
Figure 5B:
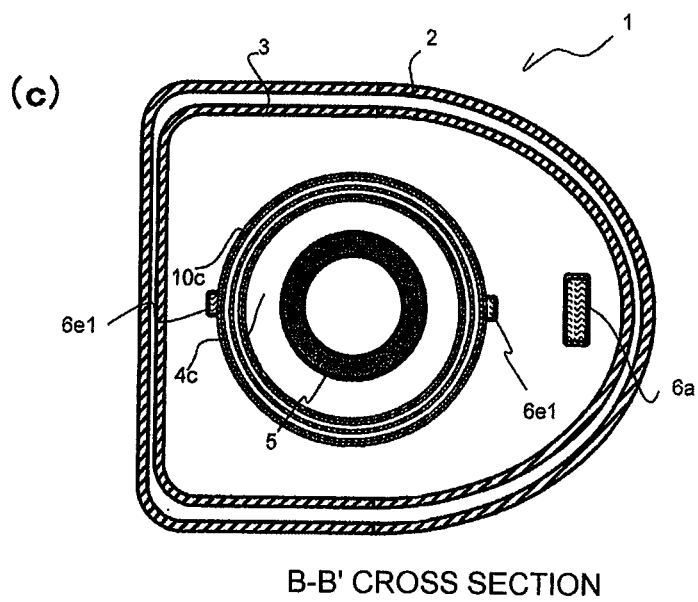
FIG. 5B is a cross-sectional view of the superconducting magnet device according to the fourth embodiment of the invention, in which (a) shows a lateral cross section taken along the line B-B' of FIG. 5A (a) and (b) shows a lateral cross section taken along the line C-C' of FIG. 5A(a).
Figure 5B:
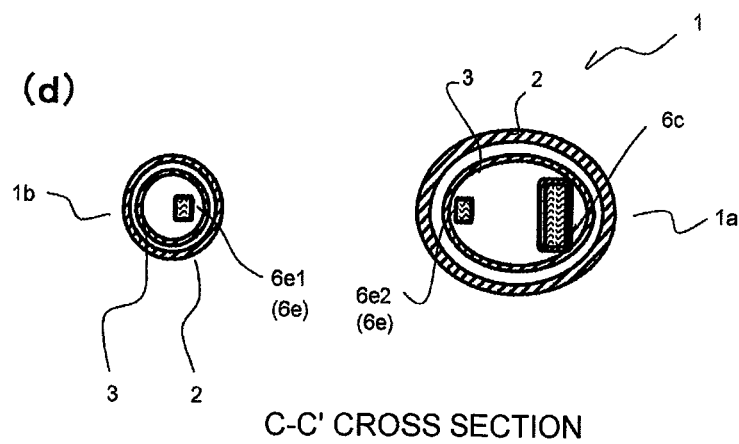

FIG. 5A is a cross-sectional view of the superconducting electromagnet 1 according to the fourth embodiment, in which (a) shows a vertical cross section at the center position and (b) shows a lateral cross section taken along the line A-A' of (a). FIG. 5B is also a cross-sectional view of the superconducting magnet device 1 according to the fourth embodiment, in which (a) shows a lateral cross section taken along the line B-B' of FIG. 5A(a) and (b) shows a lateral cross section taken along the line C-C' of FIG. 5A(a).

The same elements as those in the first embodiment and the like are denoted by the same reference numerals as those used in the first embodiment and the like, and the description thereof will not appropriately be repeated.

The superconducting magnet device 1 of the fourth embodiment is an MRI device of open type (see FIG. 1 of JP-A-2011-194136, etc.) and thus is of a different type from the superconducting magnet device 1 of the third embodiment that is the MRI device of the tunnel type (see FIG. 4). More specifically, the superconducting magnet device 1 is divided into an upper side and a lower side, the upper side of the device is supported by the lower side of the device through two struts 1a, 1b, and an opening section 24 is formed between the upper side and the lower side of the device. Here, the superconducting coils 4a, 4b are disposed in the upper side of the device while the superconducting coils 4c, 4d are disposed in the lower side of the device, and the opening section 24 is interposed therebetween. Of the coils, the superconducting coils 4b, 4c serve as the main coils, and the superconducting coils 4a, 4d serve as the shield coils.

In other words, in the fourth embodiment, "a center axis of the superconducting coil is vertically directed, and the superconducting coils are disposed with an opening section, which is horizontally provided, being interposed therebetween".

The coil bobbins 5 are provided on both of the upper side and the lower side of the device, and the corresponding one of the superconducting coils 4 is wound around each of the coil bobbins 5 from the outer peripheral side. Then, the corresponding one of the protective resistors 10 (the protective resistor tubes 10a to 10d) is wound around each of the superconducting coils 4 from the outer peripheral side. The inside of each of the protective resistor tubes 10a to 10d is communicated with each other, and the high-boiling-point refrigerant supplied from the high-boiling-point refrigerant supply section 22a flows through the protective resistor tube 10a→the protective resistor tube 10b→the protective resistor tube 10c→the protective resistor tube 10d→in this order and is discharged from the high-boiling-point refrigerant discharge section 22b. In FIG. 5A and the like, a connection relationship among the protective resistor tubes 10a to 10d is not shown.

The thermo-siphon section 6 of the fourth embodiment includes the refrigerant descending flowpath section 6c, the lower flowpath section 6d, refrigerant ascending flowpath sections 6e1, 6e2, the upper flowpath section 6f, and the liquid reservoir section 6g, and these components are connected in this order. In addition, the refrigerant supply and discharge section 23 connects between the upper space of the liquid reservoir section 6g and the outside. Then, the refrigerants are introduced from the shared refrigerant discharge section 23 such that the high-boiling-point refrigerant and the refrigerant R are respectively spread in the thermo-siphon section 6 during the initial cooling and after the initial cooling. During the normal operation after the initial cooling, the refrigerant R circulates in the thermo-siphon section 6 by the thermo-siphon to promote the cooling of the inside of the device.

Since the operation of the thermo-siphon section 6 in the superconducting magnet device 1 of the fourth embodiment is similar to that of the second embodiment, the components thereof are denoted by substantially the same reference numerals as those of the second embodiment.

As shown in FIG. 5A(b), the lower flowpath section 6d is provided to cross an end from another end of the device. With the flow of the refrigerant R as a reference, a terminating end (a lower end) of the refrigerant descending flowpath section 6c is connected to a starting end of the lower flowpath section 6d, a starting end (a lower end) of the refrigerant ascending flowpath section 6e1 is connected to a terminating end of the lower flowpath section 6d, and a starting end (a lower end) of the refrigerant ascending flowpath section 6e2 is connected to a side near the starting end of the lower flowpath section 6d. Then, the flow of the refrigerant R from the refrigerant descending flowpath section 6c is divided into the refrigerant ascending flowpath sections 6e1, 6e2 (see FIG. 5B (a)).

Although the upper flowpath section 6f is positioned between each of the refrigerant ascending flowpath sections 6e1, 6e2 and the liquid reservoir section 6g, the upper flowpath section 6f has a configuration corresponding to the lower flowpath section 6d, and thus the description thereof will not be made.

Of the refrigerant ascending flowpath sections 6e1, 6e2, the refrigerant ascending flowpath section 6e1 passes through the inside of the strut 1a, and the refrigerant ascending flowpath section 6e2 passes through the inside of the strut 1b. Then, the refrigerant ascending flowpath sections 6e1, 6e2 are configured to be bent and rise to follow outer peripheral shapes of the coil bobbins 5a to 5d around which the superconducting coils 4a to 4d and the protective resistor tubes 10a to 10d are wound respectively, and thus can promote the cooling of the superconducting coils 4a to 4d.

Also in the fourth embodiment, the cooling by the high-boiling-point refrigerant is performed during the initial cooling through the protective resistor 10 (the protective resistor tubes 10a to 10d) and through the thermo-siphon section 6. Accordingly, compared to a case where the cooling is performed only through the thermo-siphon section 6 as in the conventional art, it is possible to achieve the rapid cooling. In addition, the cooling by the refrigerant R (liquefied helium) is performed and the high-boiling-point refrigerant is frozen while the high-boiling-point refrigerant (liquefied nitrogen) remains in the high-boiling-point refrigerant path (the internal space S) in each of the protective resistor tubes 10a to 10d. Thus, thermal stability during the quench phenomenon and the like is improved by the high specific heat (and further heat of fusion) of the high-boiling-point refrigerant.

According to the fourth embodiment, the cooling efficiency in the circumferential direction is improved not only by the thermal conductivity in the circumferential direction of the protective resistor 10 that is wound around the outer side of the superconducting coil 4 but also by the plural refrigerant flowpaths (the refrigerant ascending flowpaths 6e1, 6e2 that are provided in opposite positions with the center axis 21 being interposed therebetween). In addition, by adopting such a structure, there is no need to dispose the plural refrigerant containers on the upper and lower sides in the superconducting electromagnet device 1, in which the plural superconducting coils 4 are disposed with the opening section 24 being interposed therebetween, and it is thus possible to downsize the superconducting electromagnet device 1.

Although an example that the two struts 1a, 1b are provided is described in the fourth embodiment, this embodiment can also be applied to the MRI device of the open type in which the only one strut is provided. In this case, a member that communicates between the refrigerant descending flowpath 6c and the refrigerant ascending flowpath 6e (6e1, 6e2) and between the protective resistor tubes 1b, 10c, and the like are contained in the one strut. Here, the refrigerant ascending flowpaths 6e1, 6e2 may be joined, pass through the strut as a single flowpath, and be divided after passing through the strut. In addition, the example is shown in which the two refrigerant ascending flowpaths 6e exist and are denoted by the reference numerals 6e1, 6e2; however, the number of the refrigerant ascending flowpath as a whole may be one, three, or more.

REFERENCE SIGNS LIST

1: superconducting electromagnet device
2: vacuum insulating container
3: radiation shield
4, 4a, 4b, 4c, 4d: superconducting coil
5: coil bobbin
6: thermo-siphon section (refrigerant circulation flowpath)
6a: lower body section
6b: upper body section
6c: refrigerant descending flowpath section
6d: lower flowpath section
6e: refrigerant ascending flowpath section
6f: upper flowpath section
6g: liquid reservoir section
9: permanent current switch
10: protective resistor
10a: resistor tube section
10b: high-boiling-point refrigerant path section
11: protective resistor accommodating section
12: refrigerator
13: DC power source
14: current breaker
20: arrow indicative of flowing direction of vaporized refrigerant
21: center axis of superconducting electromagnet device
22: high-boiling-point refrigerant supply and discharge section (high-boiling-point refrigerant supply section, flowpath connected to outside)
22a: high-boiling-point refrigerant supply section
22b: high-boiling-point refrigerant discharge section
23: refrigerant supply and discharge section
23a: refrigerant supply section
23b: refrigerant discharge section
24: opening section
S: internal space

The invention claimed is:

1. A superconducting electromagnet device comprising:
a refrigerant circulation flowpath in which a refrigerant circulates;
a refrigerator for cooling vapor of the refrigerant in the refrigerant circulation flowpath;
a superconducting coil cooled by the circulating refrigerant;

a protective resistor thermally contacting the superconducting coil and having an internal space;

a high-boiling-point refrigerant supply section for supplying a high-boiling-point refrigerant to the internal space in the protective resistor, the high-boiling-point refrigerant having a higher boiling point than the refrigerant and being frozen by the refrigerant; and a vacuum insulating container for at least accommodating the refrigerant circulation flowpath, the superconducting coil, and the protective resistor.

2. The superconducting electromagnet device according to claim 1, wherein the high-boiling-point refrigerant is supplied from the high-boiling-point refrigerant supply section to the internal space of the protective resistor to cool the superconducting coil during initial cooling, and cooled and frozen by the refrigerant in the internal space after the initial cooling.

3. The superconducting electromagnet device according to claim 1, wherein the protective resistor is formed as a protective resistor tube having the internal space as a tubular path, and the protective resistor tube is wound around an outer peripheral side and/or an inner peripheral side of the superconducting coil to thermally contact the superconducting coil.

4. The superconducting electromagnet device according to claim 1, wherein the protective resistor is configured that a normal conductive wire of oxygen-free copper or equivalent of oxygen-free copper is wound in a nonconductive manner to prevent magnetic coupling with the superconducting coil.

5. The superconducting electromagnet device according to claim 1, wherein the protective resistor has a structure in which a normal conductive wire is wound tightly, and is configured that the refrigerant flowing through the refrigerant circulation flowpath passes through a space between the tightly wound normal conductive wire.

6. The superconducting electromagnet device according to claim 1, wherein plural refrigerant circulation flowpaths penetrate the inside of the protective resistor.

7. The superconducting electromagnet device according to claim 1, wherein a center axis of the superconducting coil is horizontally directed, and the protective resistor thermally contacts any of an outer peripheral surface, an inner peripheral surface, and a bobbin of the superconducting coil.

8. The superconducting electromagnet device according to claim 1, wherein a center axis of the superconducting coil is vertically directed, and the superconducting coils are disposed with an opening section, which is horizontally provided, being interposed therebetween.

9. A cooling method for a superconducting electromagnet device including:

a refrigerant circulation flowpath in which a refrigerant circulates;

a refrigerator for cooling vapor of the refrigerant in the refrigerant circulation flowpath;

a superconducting coil cooled by the circulating refrigerant;

a protective resistor that is connected in parallel with the superconducting coil; and a vacuum insulating container for at least accommodating the refrigerant circulation flowpath, the superconducting coil, and the protective resistor, wherein the protective resistor is formed to thermally contact the superconducting coil and have an internal space that includes a flowpath connected to the outside, during initial cooling, a high-boiling-point refrigerant that has a higher boiling point than the refrigerant and is frozen by the refrigerant is supplied to the internal space from the flowpath connected to the outside, and the high-boiling-point refrigerant is further supplied to the refrigerant circulation flowpath to cool a superconducting magnet, and after the initial cooling, the superconducting magnet is cooled by supplying the refrigerant after the low-boiling-point refrigerant is removed from the refrigerant circulation flowpath, and the high-boiling-point refrigerant that remains in the internal space is frozen.

10. A magnetic resonance imaging device comprising the superconducting electromagnet device according to claim 1.

* * * * *